United States Patent [19]

Kaji et al.

[11] 4,042,726
[45] Aug. 16, 1977

[54] SELECTIVE OXIDATION METHOD

[75] Inventors: Tadao Kaji, Kokubunji; Tsuneaki Kamei, Mitaka; Keiji Miyamoto, Hinode, all of Japan

[73] Assignee: Hitachi, Ltd., Japan

[21] Appl. No.: 611,206

[22] Filed: Sept. 8, 1975

[30] Foreign Application Priority Data

Sept. 11, 1974 Japan .................. 49-103928

[51] Int. Cl.² ............... H01L 21/306; H01L 21/312
[52] U.S. Cl. .................................. 427/93; 156/648;
156/653; 156/656; 156/657; 357/50
[58] Field of Search .............. 156/3, 8, 11, 17, 648,
156/650–657, 662; 427/93, 82, 95, 248, 294;
29/580; 357/50

[56] References Cited

U.S. PATENT DOCUMENTS

| | | | |
|---|---|---|---|
| 3,290,753 | 12/1966 | Chang | 156/17 X |
| 3,488,564 | 1/1970 | Crafts | 357/50 X |
| 3,700,497 | 10/1972 | Epifano et al. | 156/17 X |
| 3,772,577 | 11/1973 | Planey | 357/50 X |
| 3,810,796 | 5/1974 | Skaggs et al. | 156/8 |
| 3,920,861 | 11/1975 | Dean | 156/17 X |
| 3,966,577 | 6/1976 | Hochberg | 29/580 X |

*Primary Examiner*—William A. Powell
*Attorney, Agent, or Firm*—Craig & Antonelli

[57] ABSTRACT

A method for manufacturing a semiconductor device wherein semiconductor material is selectively removed from a principal surface of a semiconductor substrate having at least one semiconductor layer formed thereon to provide a groove that extends through said layer and into the substrate and wherein the semiconductor material of the substrate is selectively oxidized to form an oxide insulator layer within the groove. The groove has a width which is smaller than the thickness of the semiconductor layer and the oxide insulator layer serves to isolate a portion of the semiconductor layer from adjacent portions of the substrate.

4 Claims, 9 Drawing Figures

SELECTIVE OXIDATION METHOD

DETAILED DESCRIPTION OF THE INVENTION

This invention relates to a selective oxidation method and in particular, to an oxide isolation technique.

Fabrication of semiconductor integrated circuits requires essentially isolation techniques in order to isolate elements from each other electrically. An iso-planar technique is a typical of these techniques, and features in forming a part of isolation regions with silicon dioxide ($SiO_2$) by means of selective oxidation. According to this iso-planar technique, the periphery of an element-forming region 2 on a silicon substrate 1 is encompassed by selectively oxidized silicon dioxide 3 as shown in FIG. 1 so that a base 4 and an emitter 5 can be formed in a self-alignment.

In the iso-planar technique as mentioned above, the width W of the $SiO_2$ isolation region 3 is determined by a maximum bias potential impressed between elements. When the thickness of the element-forming region (epitaxial growth layer) 2 is 1-2 $\mu$m, for example, the width W thereof is set to 9-13 $\mu$m in order to obtain an adequate withstand voltage. For this reason, space requirement of the isolation region 3 becomes inevitably severer remarkably thereby lowering the density of integration of the device as a whole. Since the volume of the above-mentioned $SiO_2$ isolation region 3 is also large, moreover, a longer period of time is required for thermal oxidation in the fabrication of the same with undesirable consequence that thermal strain is created in the epitaxial growth layer ($E_p$ layer)2.

The primary object of the present invention is, therefore, directed to shorten a thermal oxidation time and minimize the width of an oxide isolation region in fabrication of the oxide isolation region.

To accomplish these objects, in accordance with the present invention, the width $x$ of a silicon dioxide isolation region 31 (correctly speaking, the width of an etching groove to be oxidized selectively) is minimized to 0.1-2 $\mu$m (at least smaller than the thickness of $E_p$ layer 2), as shown in FIG. 2. At the same time, the depth $y$ thereof penetrates an N+ buried layer 6 so as to thereby secure adequate withstand voltage between the elements. In this instance, the characteristic feature of the present invention resides in that the width $x$ of the $SiO_2$ isolation region 31 is made smaller than the depth $y$ thereof.

An embodiment of the selective oxidation method in accordance with the present invention is now explained with reference to FIGS. 3A through C.

With reference to FIG. 3A initially, by an epitaxial growing technique, the $E_p$ layer 2 is first formed on the silicon semiconductor substrate 1, and a thermally oxidized $SiO_2$ layer 7 and a mask layer 8 corresponding thereto are then formed on the $E_p$ layer 2, respectively. Next, etching is effected onto the $SiO_2$ layer 7 through a fine aperture 8a disposed on the mask layer 8 to thereby define a fine aperture 7a similarly on the $SiO_2$ layer 7.

These fine apertures 7a and 8a are located at a position corresponding to the position of the Si substrate 1 where the isolation region 31 is to be defined, and furthermore, the width thereof is set to about 0.1-2 $\mu$m so that it is at least smaller than the thickness of the above-mentioned $E_p$ layer 2.

Next, as shown in FIG. 3B, an etching groove 9 is defined by etching the substrate 1 and the $E_p$ layer 2 respectively through the fine apertures 7a and 8a formed on the surfaces thereof. In this instance, the etching groove divides the $E_p$ layer 2, and at the same time, it is bored in such a depth that an adequate withstand voltage is secured between the elements to be formed on the $E_p$ layer 2. As the etching method for this purpose, it is therefore preferred to employ an etching method that has a high etching directivity such as reverse spattering or ion-etching.

Subsequently the mask layer 8 is removed by etching, and the Si substrate 1 is then subjected to thermal oxidation whereby the above-mentioned etching groove 9 is buried by a silicon dioxide membrane 10. In this case, the etching groove 9 is buried gradually by silicon dioxide while the $SiO_2$ formed by the thermal oxidation at both sides of the groove 9 is colliding with each other. Accordingly, the heat-treatment time in the present invention is reduced to at least half in comparison with a customary method wherein the width of an etching groove is maintained larger in order to secure an adequate withstand voltage between the elements.

By referring to FIGS. 4A-D, an explanation is now given in detail how to form the mask layer 8 which has the above-mentioned fine aperture 8a.

After the $E_p$ layer 2 is first formed on the Si substrate 1 as shown in FIG. 4A, there are deposited on the $E_p$ layer 2 a thermally oxidized $SiO_2$ 7, a mask-forming Cr layer 11, and locally a polyimide resin layer 12 for lifting-off.

Next, as shown in FIG. 4B, the Cr layer 11 is removed selectively by etching, using the uppermost polyimide resin layer 12 as its etching mask. The side etching quantity at this time is set to about 1 $\mu$m which is larger than a detouring flow quantity of the vacuum-deposited Cr in the subsequent vacuum deposition step.

As shown in FIG. 4C, the Cr is then deposited by vacuum evaporation over the entire upper surface of the Si substrate 1 to which the etching treatment of the above-mentioned Cr layer 11 has already been effected. Since the polyimide resin layer 12 is deposited sufficiently thickly for the purpose of lifting-off, the vacuum-deposited Cr hardly attaches to the side surface sections of the polyimide resin layer 12 whereby a step-cut is defined between the Cr formed on the layer 12 and the Cr deposited on the $SiO_2$ layer 7. Moreover, since the side etching quantity is pre-set to be larger than the detouring flow quantity of the vacuum-deposited Cr, a fine gap 14 is formed between the Cr 11 on the $SiO_2$ layer 7 and the Cr 13.

Thereafter, as shown in FIG. 4D, of the vacuum-deposited Cr 13, the Cr on the polyimide resin layer 12 is removed simultaneously with the etching of the layer 12 whereby the Cr mask layers 11, 13 (8) having fine apertures 14 (8a) are formed on the $SiO_2$ layer 7.

Incidentially, the mask 8 (7) for the etching of portions of the substrate to be oxidized selectively can be formed either by means of an electron beam or a laser beam. When a pattern fabrication technique using the above-mentioned lift-off technique is employed alternatively, all the pellets on the Si wafer can be treated simultaneously.

The present invention can serve for a wide range of applications for selectively forming fine oxidized regions on the surface of a semiconductor substrate including not only a bipolar integrated circuit, but also a MOS IC and the like.

Thus in accordance with the selective oxidation method of this invention, the width of isolation regions is minimized to about 0.1–2 μm in comparison with the conventional width of 9–13 μm so that a degree of integration of the device as a whole is improved remarkably and at the same time, the treatment time is shortened drastically since the thermally generated $SiO_2$ grows from both side planes of the etching groove.

Figure 1:
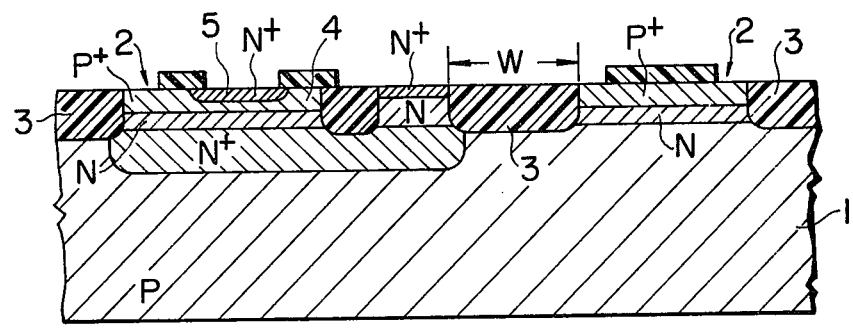
FIG. 1 is a cross-sectional view of a device prepared in accordance with a conventional iso-planar technique.
Figure 2:
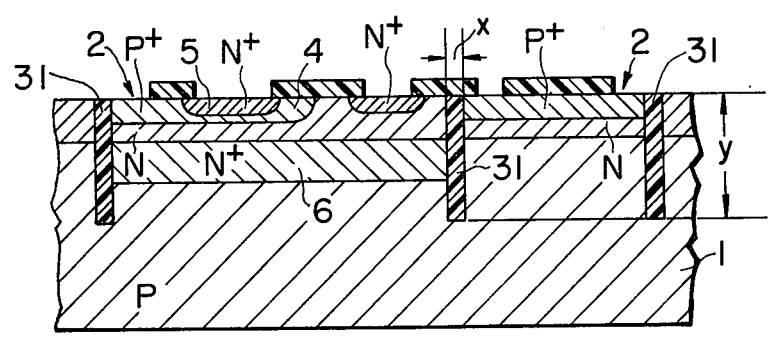
FIG. 2 is a cross-sectional view of a device prepared in accordance with the selective oxidation method of this invention.
Figure 3A:
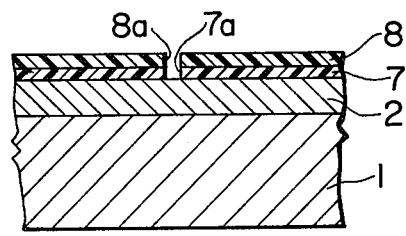
FIG. 3A through C are diagramatical views showing the treatment steps in an embodiment of the present invention.
Figure 3B:
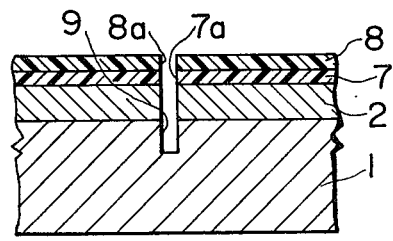
Figure 3C:
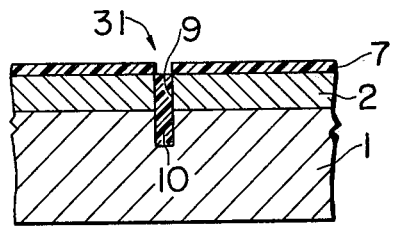
Figure 4A:
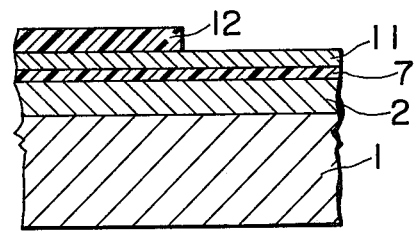
FIGS. 4A through D are diagramatical views showing the steps for forming the mask having a fine aperture in accordance with the above-mentioned embodiment of the present invention.
Figure 4B:
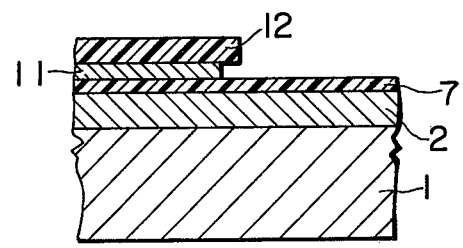
Figure 4C:
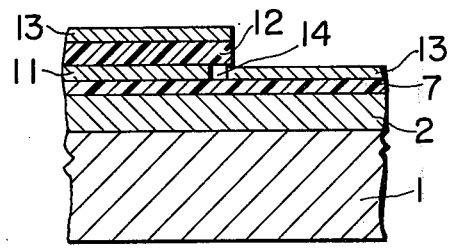
Figure 4D:
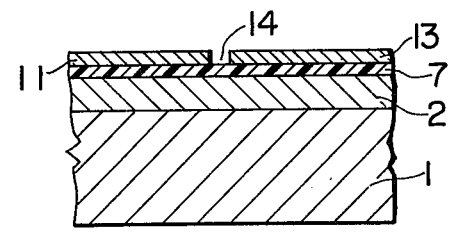

1 ... Si substrate
2 ... Element-forming region (Epitaxial growth layer)
3, 31 ... $SiO_2$ isolation region
6 ... N+ buried layer
7 ... Thermally oxidized $SiO_2$ layer
8 ... Mask Layer
7a, 8a ... Fine apertures
9 ... Etching groove
10 ... Selectively oxidized $SiO_2$
11 ... Cr layer
12 ... Polyimide resin layer
13 ... Vacuum deposited Cr layer
14 ... Gap (fine aperture)

What is claimed is:

1. A method of manufacturing a semiconductor device which comprises the steps of:
    1. forming an insulating film on the principal surface of a semiconductor substrate having at least one semiconductor layer thereon,
    2. forming a metallic layer on said insulating film,
    3. selectively forming a mask on said metallic layer,
    4. applying an etchant to the selectively formed mask and metallic layer to etch said metallic layer beneath an edge of said mask,
    5. forming further metallic layer on part of the exposed insulating film so as to leave a gap between areas of metallic material on said insulating film beneath said mask,
    6. removing said mask to expose said gap,
    7. selectively etching said insulating film and said substrate by way of the gap in the metallic material in the surface of said insulating film to form a groove in said insulating film and said substrate which extends through said layer into said substrate and which has a width smaller than the thickness of said layer, and
    8. selectively oxidizing the semiconductor material of said substrate to form an oxide insulator layer in said groove that isolates a portion of the semiconductor layer from adjacent portions of the substrate.

2. A method of manufacturing a semiconductor device according to claim 1, wherein each of said metallic layers is a layer of chromium.

3. A method of manufacturing a semiconductor device according to claim 2, wherein said mask is made of polyimide resin.

4. A method of manufacturing a semiconductor device according to claim 1, wherein said groove has a width of from 0.1–2μm and a depth sufficient to provide adequate withstand voltage to the oxide insulator layer formed in the groove to isolate semiconductor elements formed on said substrate.

* * * * *